(12) United States Patent
Bradley (10) Patent No.: US 7,511,577 B2
(45) Date of Patent: Mar. 31, 2009

(54) DC COUPLED MICROWAVE AMPLIFIER WITH ADJUSTABLE OFFSETS

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 174 days.

(21) Appl. No.: 11/551,551

(22) Filed: Oct. 20, 2006

(65) Prior Publication Data

US 2008/0094143 A1    Apr. 24, 2008

(51) Int. Cl.
  *H03F 3/04*    (2006.01)
(52) U.S. Cl. ............................. 330/302; 330/9; 330/296
(58) Field of Classification Search ................. 330/302, 330/9, 296
  See application file for complete search history.

(56) References Cited

U.S. PATENT DOCUMENTS

| | | | | |
|---|---|---|---|---|
| 3,617,887 A | * | 11/1971 | Alcaide | 324/120 |
| 5,249,224 A | * | 9/1993 | Chambers | 379/398 |
| 5,373,152 A | * | 12/1994 | Domon et al. | 250/214 AG |
| 5,940,500 A | * | 8/1999 | Purits | 379/399.01 |
| 6,812,786 B2 | * | 11/2004 | Jackson et al. | 330/51 |

* cited by examiner

*Primary Examiner*—Patricia Nguyen
(74) *Attorney, Agent, or Firm*—Fliesler Meyer LLP (57) ABSTRACT

An output amplifier stage covers a flat frequency range of DC to microwave frequencies with provisions for independent control of input and output DC offset. The output amplifier stage includes a standard AC coupled microwave amplifier for high frequency performance. The AC coupled amplifier is intended for use as an output stage in a pulse pattern generator, although it can be used in any application where broadband frequency operation is needed with control of DC at its input and output. The DC control is provided using circuitry providing a DC bypass path around an AC coupled amplifier. The bypass path is provided between two Bias T circuits, one Bias T before and one Bias T after the AC coupled amplifier. An adjustable DC bias offset is further provided to the AC amplifier input. A feed forward signal is further provided from the input to the output of the AC coupled amplifier to supply a missing DC and low frequency component to the AC coupling of the high frequency amplifier stage.

21 Claims, 10 Drawing Sheets

$G2(s) = \dfrac{Rs + Rs(2A-1)}{Rs} = 2A$

FIG. 11C

$G3(s) = \dfrac{(1+2ST)}{(1+ST)}$

DC COUPLED MICROWAVE AMPLIFIER WITH ADJUSTABLE OFFSETS

BACKGROUND

1. Technical Field

The present invention relates to a microwave output amplifier stage used for signal pulse pattern generators, including a traditional pulse generator, a square wave generator, or a sine wave generator. More particularly, the present invention relates to such an amplifier output stage that allows a linear amplification from DC to microwave frequencies with provisions for applying DC offset input and output signals to the amplifier stage.

2. Related Art

Figure 1:
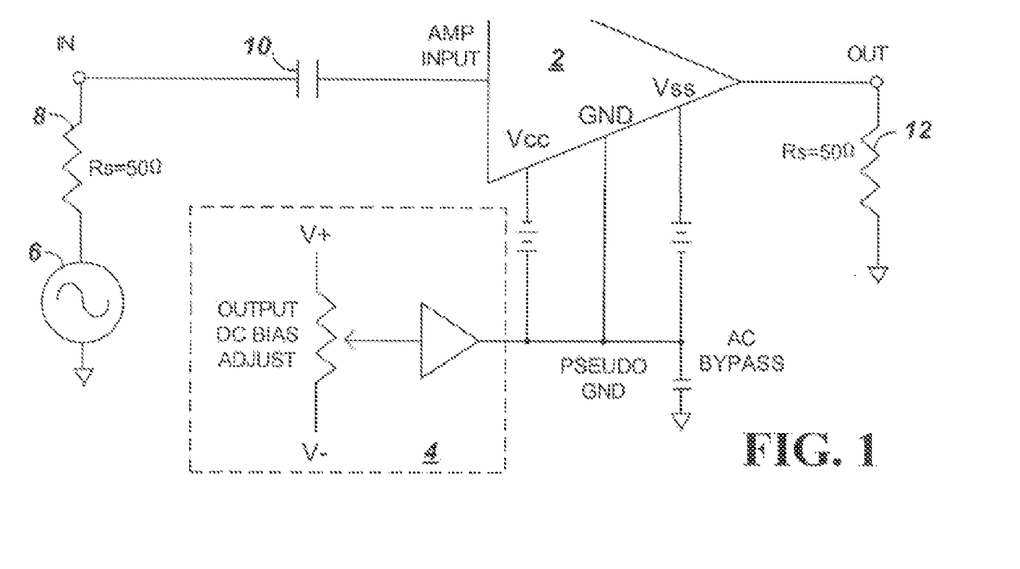
FIG. 1 shows a conventional amplifier for generating pulse patterns with DC bias supplied to the output amplifier stage.
Figure 2A:
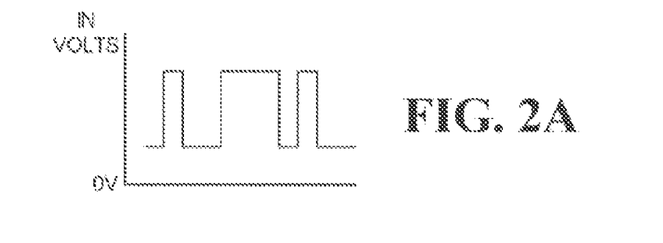
FIGS. 2A-2C shows signals provided at the input IN, input to the amplifier, and output OUT for the circuit of FIG. 1.
Figure 2B:
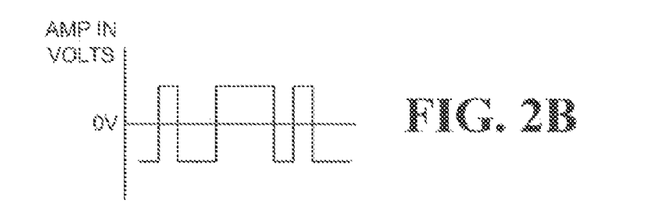
Figure 2C:
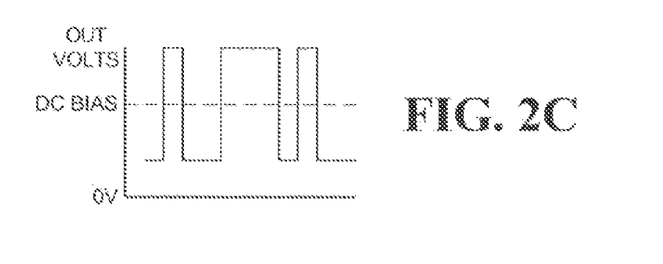

FIG. 1 shows a conventional amplifier for generating pulse patterns with DC bias supplied to the output amplifier 2 using a DC bias adjustment circuit 4. The output amplifier 2 for a pulse generator typically are connected to a pseudo ground, as shown, allowing the pulse pattern output of the amplifier 2 to be varied around ground potential using bias circuit 4. A pulse signal generator input stage 6 provides an input to the amplifier 2 of the output stage through a standard Rs=50 Ohm line 8. The input IN can have a DC offset as shown in FIG. 2A. The input IN is then AC coupled by a blocking capacitor 10 to provide only an AC signal to the input of amplifier 2. As shown in FIG. 2B, the capacitor 10 has removed any offset at the input of amplifier 2. The DC bias adjustment circuit 4 then controls the output of amplifier 2 so that the output OUT is DC coupled by controlling the pseudo ground of amplifier 2. As illustrated in FIG. 2C, with the pseudo ground adjustment, the DC bias is reintroduced to the signal at the amplifier input. The input IN is, thus, AC coupled while the output OUT is DC coupled to drive a load 12 shown having a standard Rs=50 Ohm impedance. With the circuit of FIG. 1, the user defined DC output bias potential from bias circuit 4, above or below ground, must be supplied by directly controlling the pseudo ground of amplifier 2.

Figure 3:
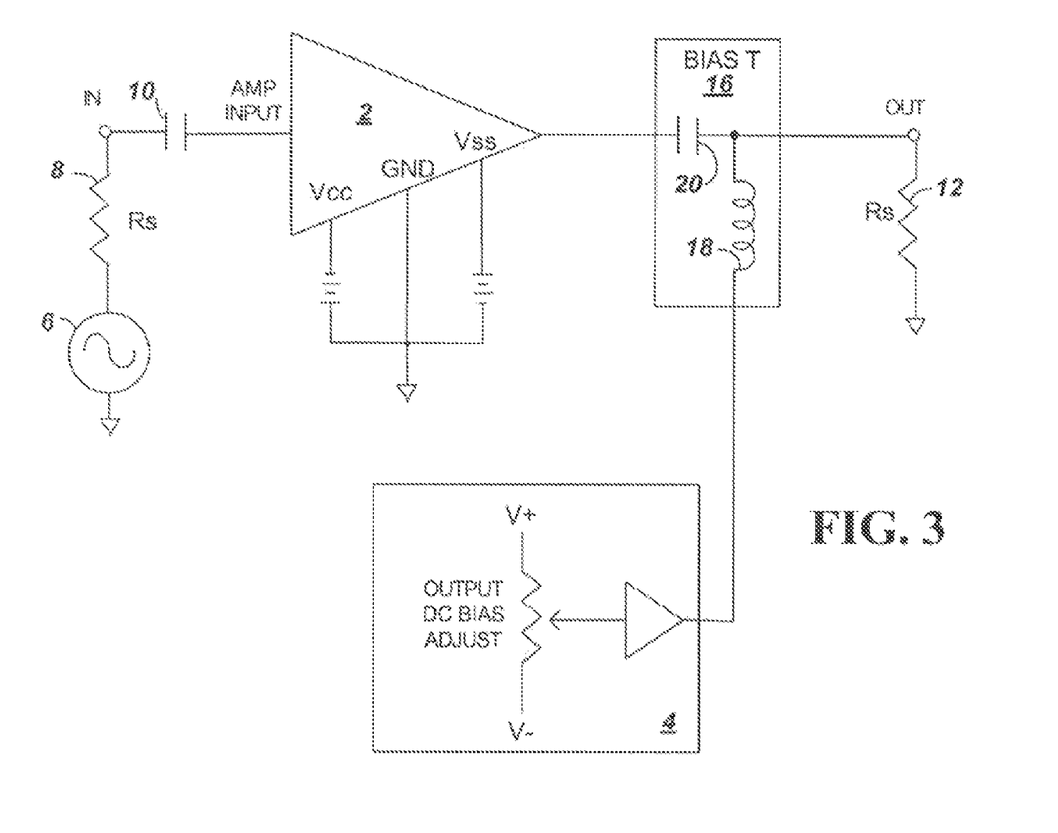
FIG. 3 shows a conventional amplifier for generating pulse patterns with DC bias supplied to a Bias T circuit.

FIG. 3 shows an alternative to the circuit of FIG. 1 for a conventional amplifier output stage for generating pulse patterns. FIG. 3 is modified by having the DC bias supplied from bias circuit 4 to a Bias T circuit 16 following the output of amplifier 2. In FIG. 3, the input to amplifier 2 is AC coupled from the input stage signal IN using blocking capacitor 10. Thus, at the input IN, the signal can be the same as shown in FIG. 2A, while the input to amplifier 2 is the same as illustrated in FIG. 2B. With the Bias T 16, while the DC bias voltage offset passes through an inductor 18 and is added in at the output OUT from amplifier 20. Thus, the output of the Bias T network 16 will have a signal as illustrated in FIG. 2C. This technique, however, now has DC blocking capacitors 10 and 20 at the input and output ports, allowing low frequency components of the pulse pattern to be susceptible to DC modulation.

It is desirable to provide a DC offset bias in an output amplifier for generating pulse patterns without requiring modification to the amplifier ground connection, or modification to affect low frequency components of the AC signal.

SUMMARY

According to embodiments of the present invention, a pulse pattern generator is provided with output stage circuitry providing an output DC offset in an AC coupled signal without the above drawbacks.

DC bias is provided for embodiments of the invention using circuitry that provides a DC bypass path around the AC coupled high frequency amplifier in the output stage. The bypass path is provided between two Bias T circuits, one Bias T before and one Bias T after the amplifier in the output stage. The circuit can also include an adjustable DC bias offset to be provided for true DC input to DC output amplification. The adjustable offset can allow for subtracting a DC bias component to eliminate the DC bias output of the preceding amplifier stage.

BRIEF DESCRIPTION OF THE DRAWINGS

Further details of the present invention are explained with the help of the attached drawings in which.

DETAILED DESCRIPTION

FIG. 14 illustrates embodiments of the present invention, wherein a DC offset is supplied to a Bias T circuit 16 following the amplifier 2 in the output stage as supplied from an amplifier bypass circuit 23 from an input Bias T stage 21 connected at the input of amplifier 2. The inclusion of a Bias T 21 at the input to the amplifier 2 allows monitoring of the DC component of the input waveform. The monitored AC portion of the waveform is processed with the analog circuitry 23, and then summed with the input and output DC bias adjust voltages provided from circuit 23 and re-injected through the Bias T 16 at the output OUT. The overall process provides a DC path from the input (IN) to the output (OUT) with a flat frequency response from DC to the upper frequency limit of the high frequency amplifier 2. Components in FIG. 4 carried over from FIGS. 1 and 3 are similarly labeled in FIG. 4, as will be components carried forward in subsequent drawings.

Figures 4, 5A, 5B:
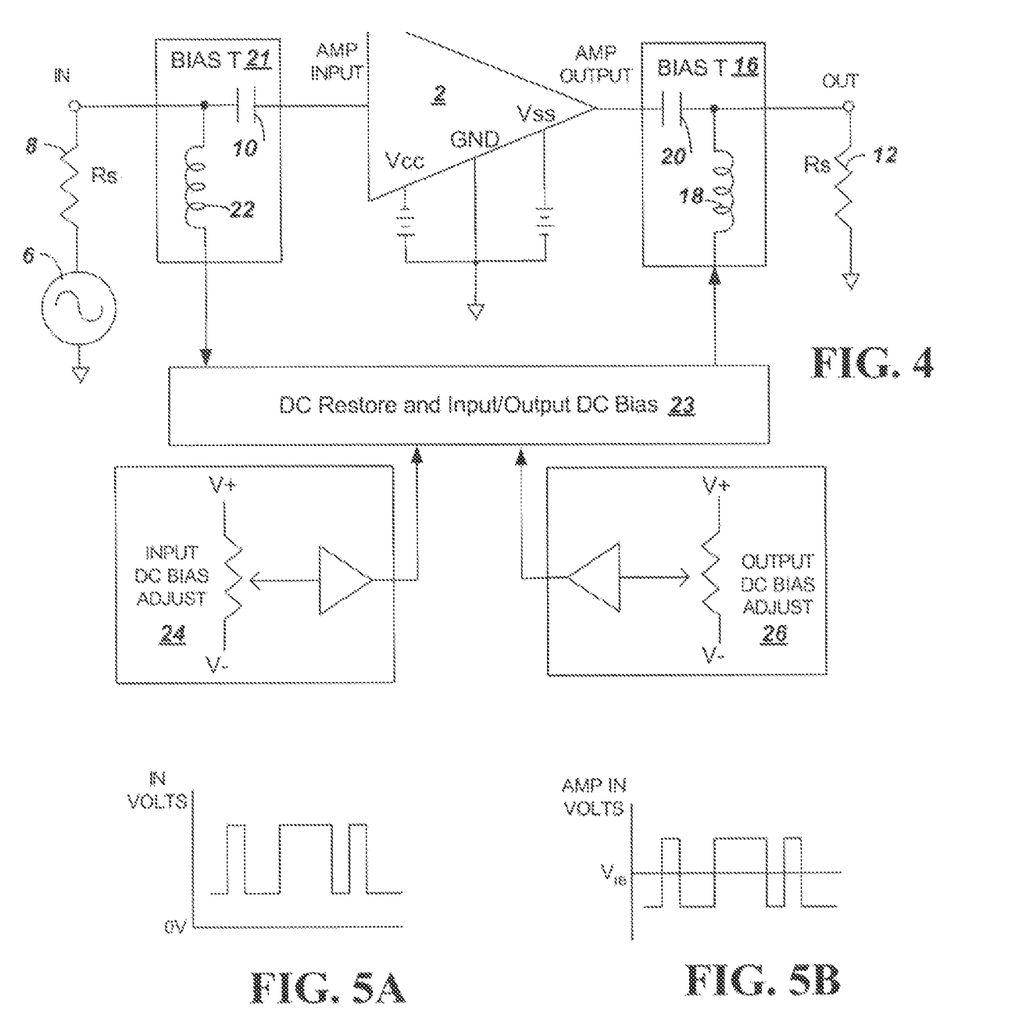
FIG. 4 illustrates embodiments of the present invention, wherein a DC offset is supplied to the Bias T circuit following the amplifier in the output stage as supplied from a amplifier bypass circuit from an additional input Bias T stage at the amplifier input.
FIGS. 5A-5D illustrate examples of voltages at different nodes in the circuit of FIG. 4.

The addition of a DC bias from DC adjustment circuit 24 to circuit 23 can provide for removal of unwanted DC potentials at the input which would be amplified and appear at the output. The Bias T 21 includes blocking capacitor 10 that allows only the AC component of the input signal to pass to amplifier 2, along with inductor 22 that carries any DC offset to and from circuit 23. The circuit 23 then provides the DC offset from inductor 22 toward Bias T 16. The circuit 24 allows subtracting out an unwanted input DC component from the overall output.

In addition to the input DC bias adjustment from circuit 24, an output DC bias adjustment is provided from an adjustment circuit 26 to the DC bias circuit 23. The DC bias from circuit 26 provides for introduction of a desired DC offset that may be different than the offset occurring in the signal at the input IN or from the adjustment provided by circuit 24. All output DC bias adjustments from DC bias circuit 23 are provided to inductor 18 of Bias T circuit. The inductor 18 is connected to the output OUT beyond DC blocking capacitor 20 to sum the AC signal from amplifier 2 with the desired DC offset.

Figure 5C:
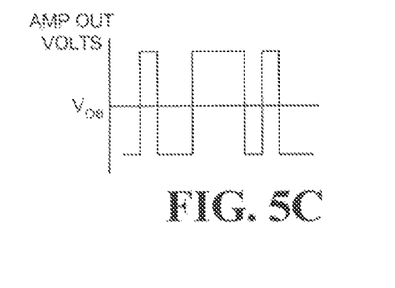
Figure 5D:
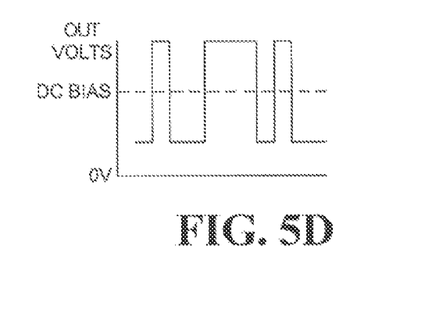

FIGS. 5A-5D illustrate examples of voltages at different nodes in the circuit of FIG. 4. FIG. 5A illustrates an input pulse signal provided at the input (IN) that has a DC offset. FIG. 5B illustrates the resulting AC signal provided at the input of the amplifier 2, after passing through the capacitor 10 of the Bias T stage 21 to remove the DC component leaving only the amplifier input offset voltage $V_{IB}$. FIG. 5C illustrates the output of amplifier 2, still with only an AC component and DC offset voltage $V_{OB}$. Finally, FIG. 5D illustrates the signal at the node OUT of the output stage illustrating introduction of the desired DC bias.

Figure 6A:
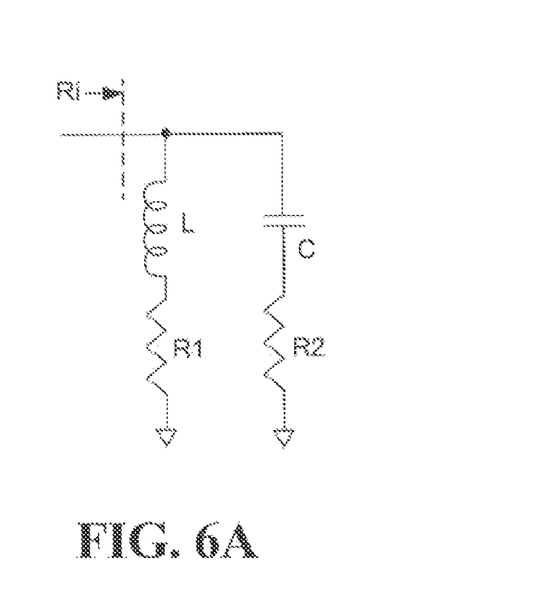
FIGS. 6A-6B illustrate components used to provide a constant input impedance of Rs Ohms.
Figure 6B:
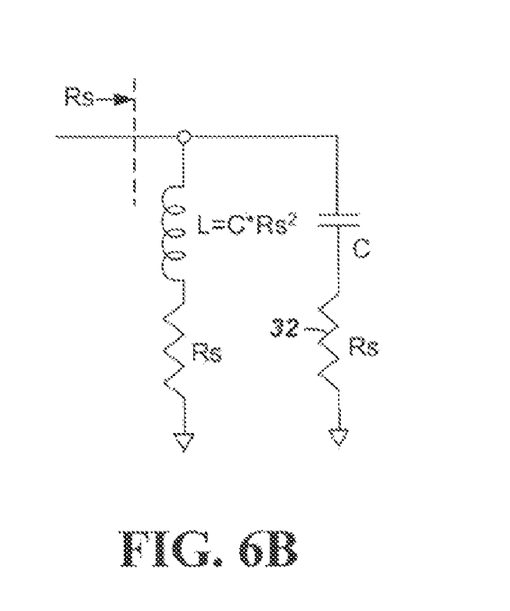

Subsequent figures illustrate construction of specific components for the bias circuit 23 and adjustment circuits 24 and 26 of FIG. 4. Initially, FIGS. 6A-6B illustrate components used to provide a constant impedance of Rs Ohms. The constant impedance at the input IN and the output OUT of the circuit of FIG. 4 allows the use of high frequency transmission lines for the interfacing of the input and output. The circuit of FIGS. 6A and 6B, thus, model components from the output OUT of FIG. 4 looking toward the amplifier 2, or alternatively from the input IN in FIG. 4 looking toward the amplifier 2.

Figure 7:
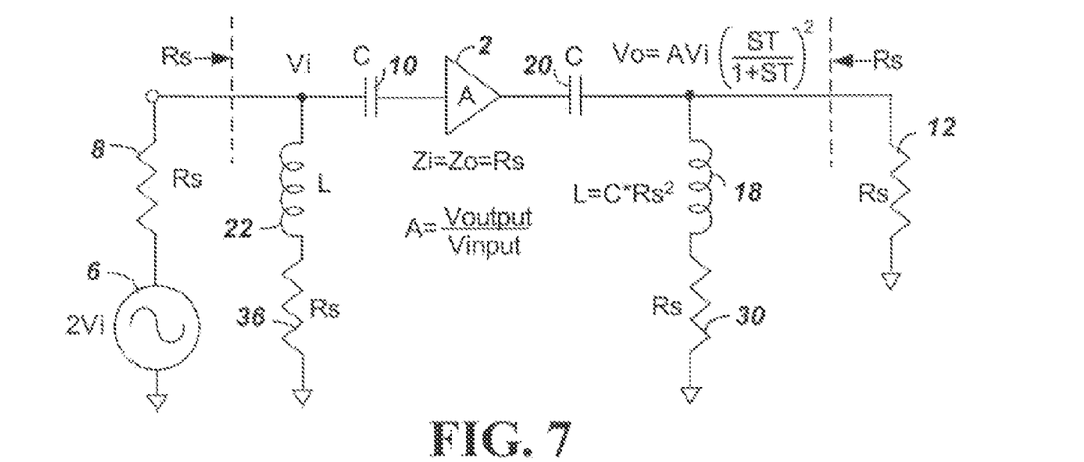
FIG. 7 shows circuit components for an output stage of a pulse generator with components provided as described with respect to FIG. 6B to provide an input and output impedance of Rs.

Kirchoff's current law and Laplace notation will be used to analyze the circuits of FIGS. 6A-6B to determine values necessary to provide a constant impedance Rs. With Laplace notation, $S=2\pi f$ where f is frequency and T is time. FIG. 6A illustrates general circuit components, and FIG. 7 illustrates circuit component values set to provide a constant impedance Rs. To provide to the constant impedance, it is observed that when R1 and R2 of FIG. 6A are set equal to a value of Rs in FIG. 6B (R1=R2=Rs), and the inductance L of FIG. 6A is set to $L=C*Rs^2$ in FIG. 6B, the network becomes purely resistance with a value of Rs Ohms. The following equations show this relation:

R1=R2=Rs $$R2*C = \frac{L}{R1}$$

Substituting values in the second equation:

L1=R1R2C $L=CRs^2$ $$C = \frac{L}{Rs^2}$$

Solving for Ri in the circuit of FIG. 6A $$Ri = \frac{(R1+SL)\left(R2+\frac{1}{SC}\right)}{R1+R2+SL+\frac{1}{SC}}$$

Substituting values derived for R1, R2 and L:

$$Ri = \frac{(Rs+SCRs^2)\left(Rs+\frac{1}{SC}\right)}{Rs+Rs+SCRs^2+\frac{1}{SC}}$$

Multiplying elements of the numerator, and factoring out Rs:

Ri=Rs.

Since circuitry from the input IN looking toward amplifier 2 and the output OUT looking toward amplifier 2 are reciprocal, the values for components derived for FIG. 6B can be used on either the input or output. Thus impedance matching can provide constant input impedance Rs at both the input (IN) and the output (OUT) of the amplifier output stage.

FIG. 7 shows circuit components for an output stage of a signal generator with components provided as described with respect to FIG. 6B both before and after the amplifier 2 since the circuitry looking toward the input of amplifier 2 is the reciprocal of the circuitry looking toward the output of amplifier 2. The components values shown provide an input IN and output OUT that are purely resistive with a value Rs. This is illustrated by the indication Zo=Zi=Rs beneath amplifier 2. The gain of the amplifier A=Vo/Vi. However, the frequency response of the amplifier 2 is a high pass function due to the dual LC high pass functions of the input and output Bias T networks. This, thus, results in the output Vo at output OUT being a function of frequency based on the following relation shown in FIG. 7;

$$Vo = AVi\left(\frac{ST}{1+ST}\right)^2$$

Subsequent figures, thus, introduce a DC or lower frequency component back into the high frequency output (OUT) signal so that at the output Vo=AVi.

Figure 8:
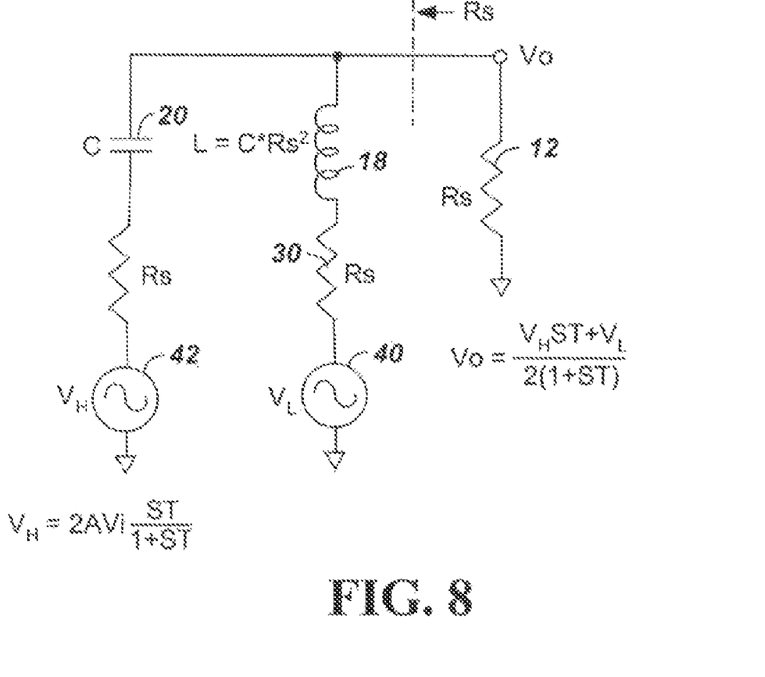
FIG. 8 shows voltage sources having values $V_H$ and $V_L$ attached to the output Bias T network. Illustrating how the a desired DC bias voltage $V_L$ can be provided to assure the output Vo=AVi.

FIG. 8 shows voltage sources having values $V_M$ and $V_L$ attached to the output Bias T network, illustrating how the desired DC bias voltage $V_L$ can be provided to Bias T 16 to create Vo=AVi can be assured. The signal source providing $V_H$ represent the high frequency AC signal from the amplifier 2, while $V_L$ represents a low frequency or DC signal component that is blocked by capacitor 20 in the input Bias T 21 in previous figures. The equation for Vo and $V_H$ are shown in terms of amplification A provided by amplifier 2, frequency f and time T. The equation needed to realize Vo=A*Vi can be determined by solving for $V_L$. Initially, the following relations have previously been defined Vo=AVi, and L=C*Rs$^2$, giving Rs*C=L/Rs=T. Substituting equations for $V_H$ and Vo, $V_L$ is determined as follows:

$$AVi = \frac{2AVi\frac{ST^2}{1+ST} + V_L}{2(1+ST)}$$

$$V_L = 2AVi\left(\frac{1+2ST}{1+ST}\right)$$

Figure 9:
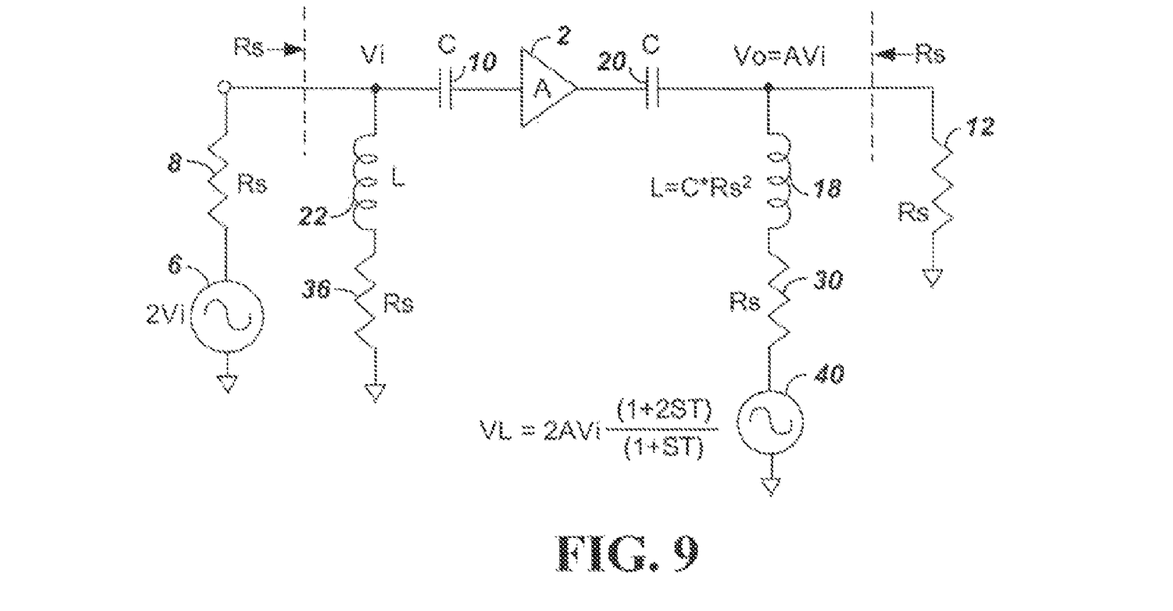
FIG. 9 illustrates voltage source providing a $V_L$ signal source as determined with respect to FIG. 8 to assure the output Vo=AVi.

According to embodiments of the present invention, a circuit is provided to produce this equation for $V_L$. FIG. 9 illustrates such a circuit with a $V_L$ signal source 40 generating the desired value connecting the resistor 30 to ground. This creates an output voltage Vo=AVi, as opposed to a Vo dependant upon frequency as represented in FIG. 7. Subsequent figures, illustrate how such a voltage source for $V_L$ can be provided.

Figure 10:
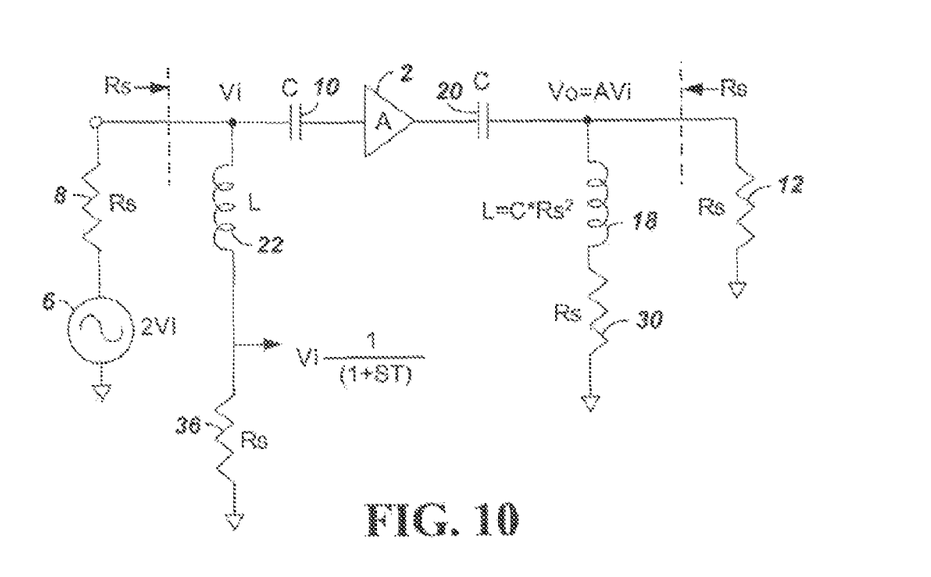
FIG. 10 illustrates the DC bias voltage provided from the input Bias T.

FIG. 10 illustrates a bias voltage available from the input Bias T. In FIG. 10, the voltage available is provided from the connection of the inductor 22 of the input Bias T to the resistor 36. Inspection to determine the value available from inductor 22 is Vi/(1+ST), as shown.

Figures 11A, 11B:
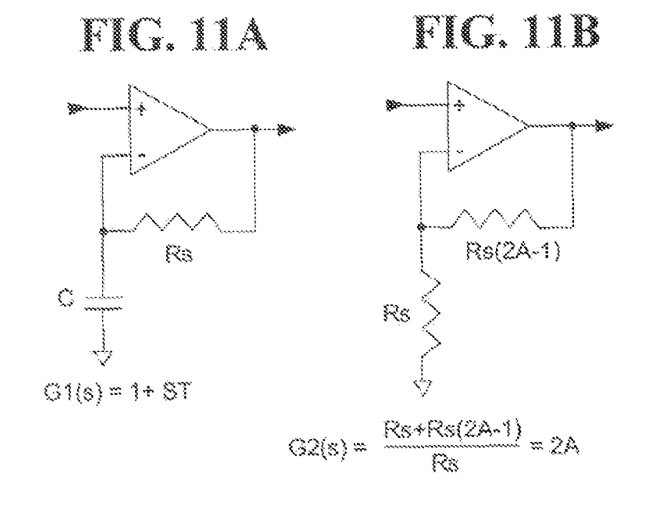
FIGS. 11A-11C illustrate one embodiment of circuitry that can be provided to produce a DC bias voltage function $G(s)=G1(s)G2(s)G3(s)$.
Figure 11C:
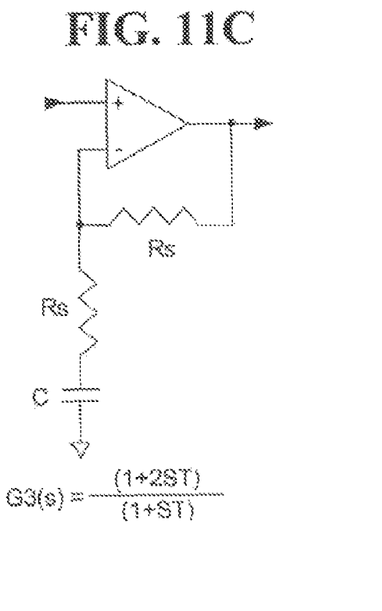

FIGS. 11A-11C illustrate one embodiment of circuitry that can be provided to produce an output of Vo=AVi upon connection to the inductor 22. The circuitry in FIG. 11A produces a value G1(s), the circuitry in FIG. 11B produces G2(s) and the circuit of FIG. 11C produces G3(s), wherein a total function G(s)=G1(s)*G2(s)*G3(s). The function G(s) multiplied by the output Vi/(1+ST) from the output of inductor 22 applied to the resistor Rs 30 and inductor L 18 will produce Vo=AVi as desired.

The circuits of FIGS. 11A-11C use amplifiers, resistors and capacitors to produce the desired functions G1(s). G2(s) and G3(s). The initial circuit in FIG. 11A produces the function G1(s)=1/(1+ST). The circuit of FIG. 11B produces the function:

$$G2(s) = \frac{Rs + Rs(2A-1)}{Rs} = 2A$$

The circuit of FIG. 11C produces the function:

$$G3(s) = \frac{(1+2ST)}{(1+ST)}.$$

Figure 12:
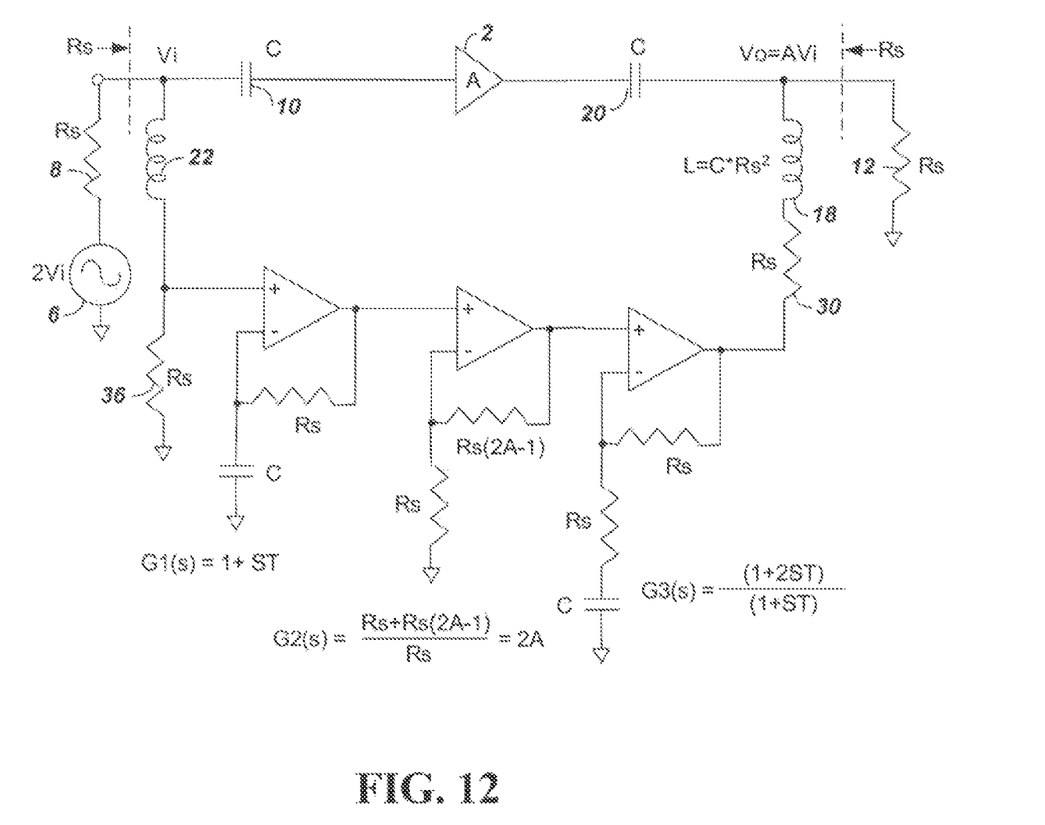
FIG. 12 shows connection of the circuits of FIGS. 11A-11C in series in the circuit of FIG. 10 to provide the function $G(s)=G1(s)G2(s)G3(s)$.

FIG. 12 shows connection of the circuits of FIGS. 11A-11C in series from inductor 22 and resistor 36 to previously grounded end of R 30 to provide the function G(s)=G1(s)G2(s)G3(s) in the circuit of FIG. 10. Although particular circuitry is shown to provide G(s) in FIGS. 11A-11C, it is understood that alternative circuitry can be arranged to produce the function G(s). This will be illustrated with the circuitry shown in FIG. 13, it is also understood that the circuitry generating the function G(s) can be connected at points before the capacitor 10 and after the capacitor 20 with slightly different values to produce a desired bypass DC bias voltage.

Figure 13:
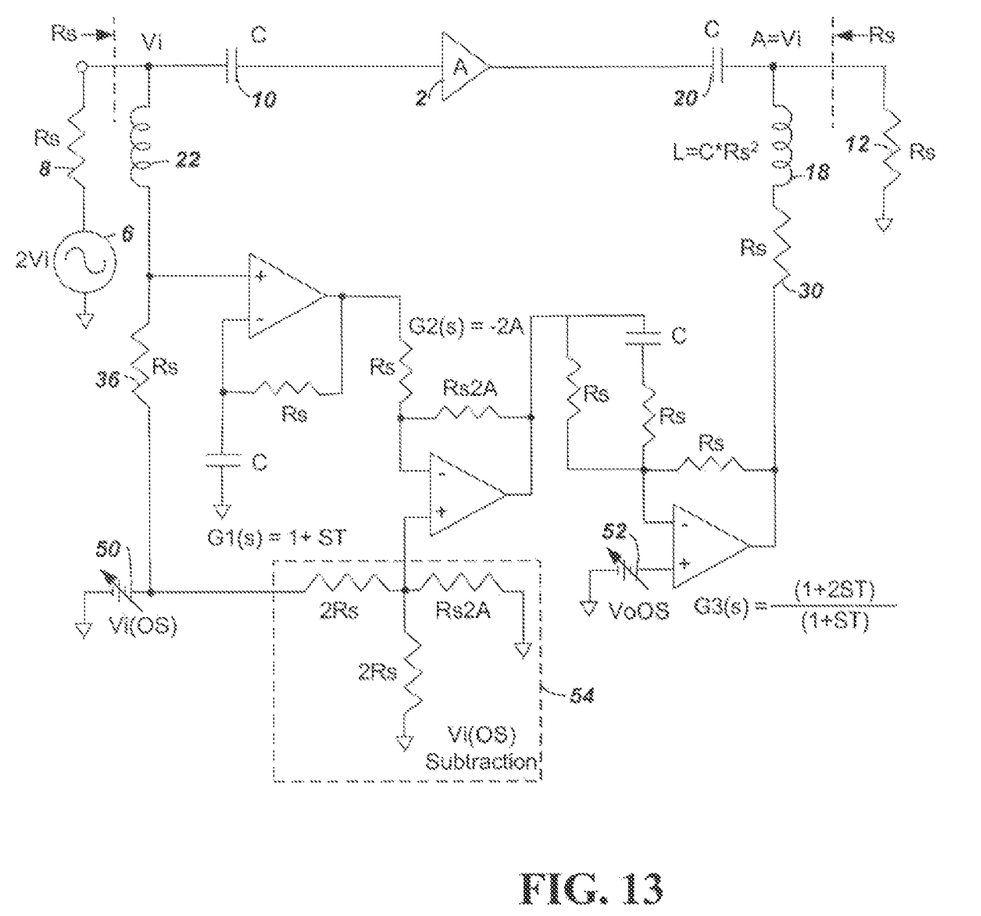
FIG. 13 shows another implementation providing both an input DC offset and an output DC offset.

FIG. 13 shows another implementation modified for the addition of a voltage source 50 providing an input DC offset and a voltage source 52 providing an output DC offset. The voltage source 50 is connected to amplifiers providing both G1(s) and G2(s). The DC bias adjustment provided by the voltage source 50 can add or remove any DC component from the input. The voltage source 50 does not affect the output Vo due to the subtraction network 54 provided by the amplifier providing the function G2(s)=−2A. The voltage source 52 connects to the amplifier providing G3(s). Note the different circuitry in FIG. 13 providing G(s) from the circuitry of FIG. 12 to enable provision of offset voltages 50 and 52 while providing a similar G(s) function. The voltage source 52 provides a user desired DC bias that will be added to the output signal of the amplifier output stage.

Figure 14:
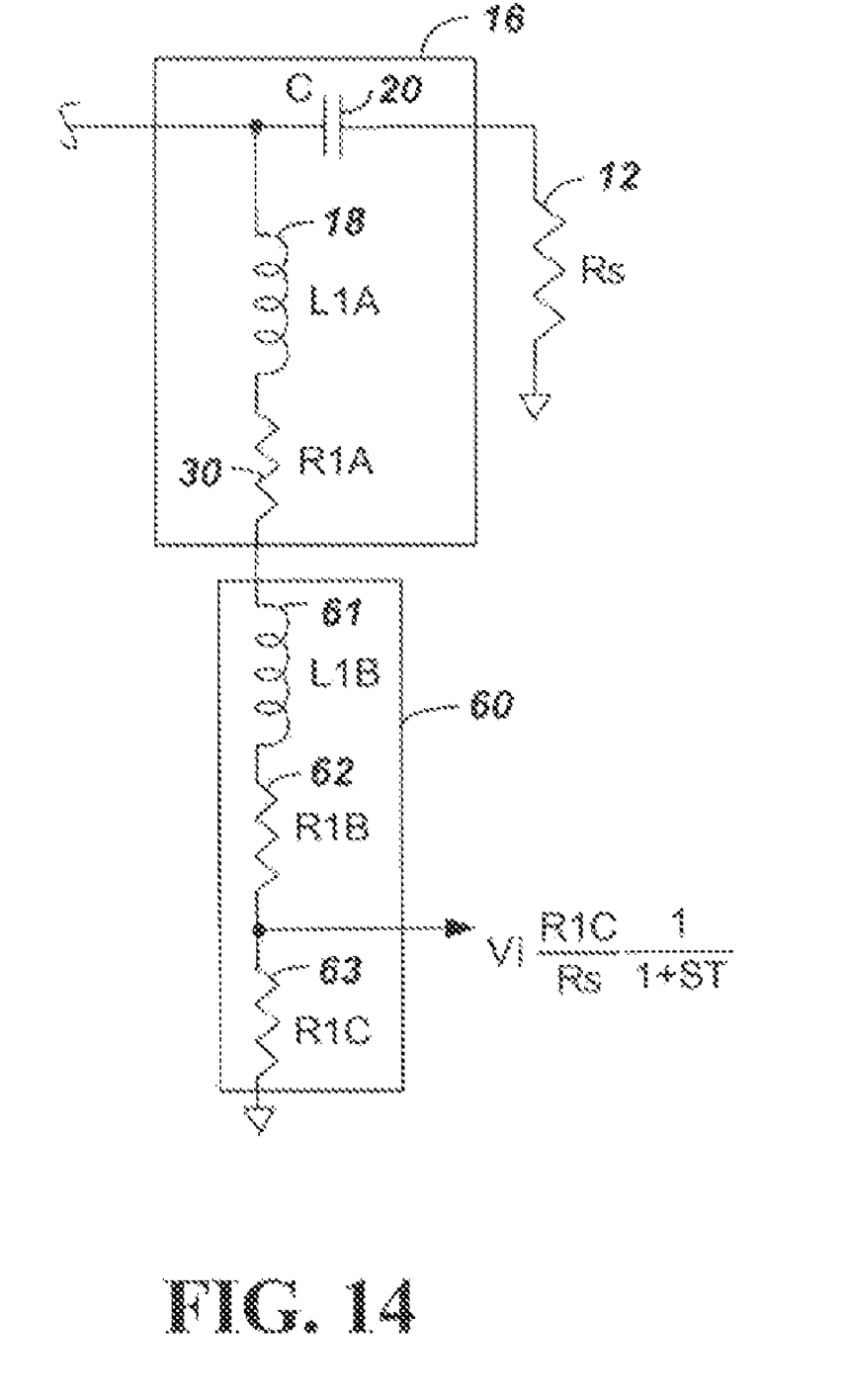
FIG. 14 illustrates additional inductances and resistances that can be added to the input and output Bias T circuits to accommodate specific design requirements.

FIG. 14 illustrates circuitry that can be added to the components of FIG. 13 to accommodate design requirements wherein a Bias T is provided with specific inductance and resistance values. A Bias T has been generally defined herein with components providing R*C=L/R. A Bias T sold by Anritsu Company, Model No. K250A has the following internal values: C=0.233 uF, L=100 uH, and R=6.2 Ohms in series with L. These values can all be manipulated externally to satisfy design criteria for a DC bypass as described herein. FIG. 14 illustrates the Bias T circuit 16, along with added circuitry 60 including additional inductor and resistor components 61-63 needed to connect in series with the Bias T, such as the K250A of Anritsu to provide a desired output Vo=Vi in one embodiment.

In one nonlimiting example with the Anritsu K250A used, values for components 61-63 can be determined. To determine the needed values, first the value C of capacitor 20 is normalized. The L needed for the C value of 0.233 uF and an Rs of 50 Ohms is calculated as L=C*Rs$^2$. Inserting values L=0.233 uF*50*50=582.5 uH. To provide this value, the inductance 482.5 uH for component 61 is then added to the internal 100 uH for inductor 18. The next thing needed is the total R in series to provide Rs, or 50 Ohms. The internal 6.2 Ohms of resistor 30 of the k250 Bias T device as well as the internal resistance 62 from the inductor 61 which is 1.0666 Ohms. This value is subtracted to determine the resistance 63 needed as 42.7344 Ohms. The R1C/Rs loss as different from Rs of 50 Ohms can be compensated for in the DC bias compensation voltage at the junction of resistors 62 and 63 using the G2(s)=2A gain stage.

Figure 15:
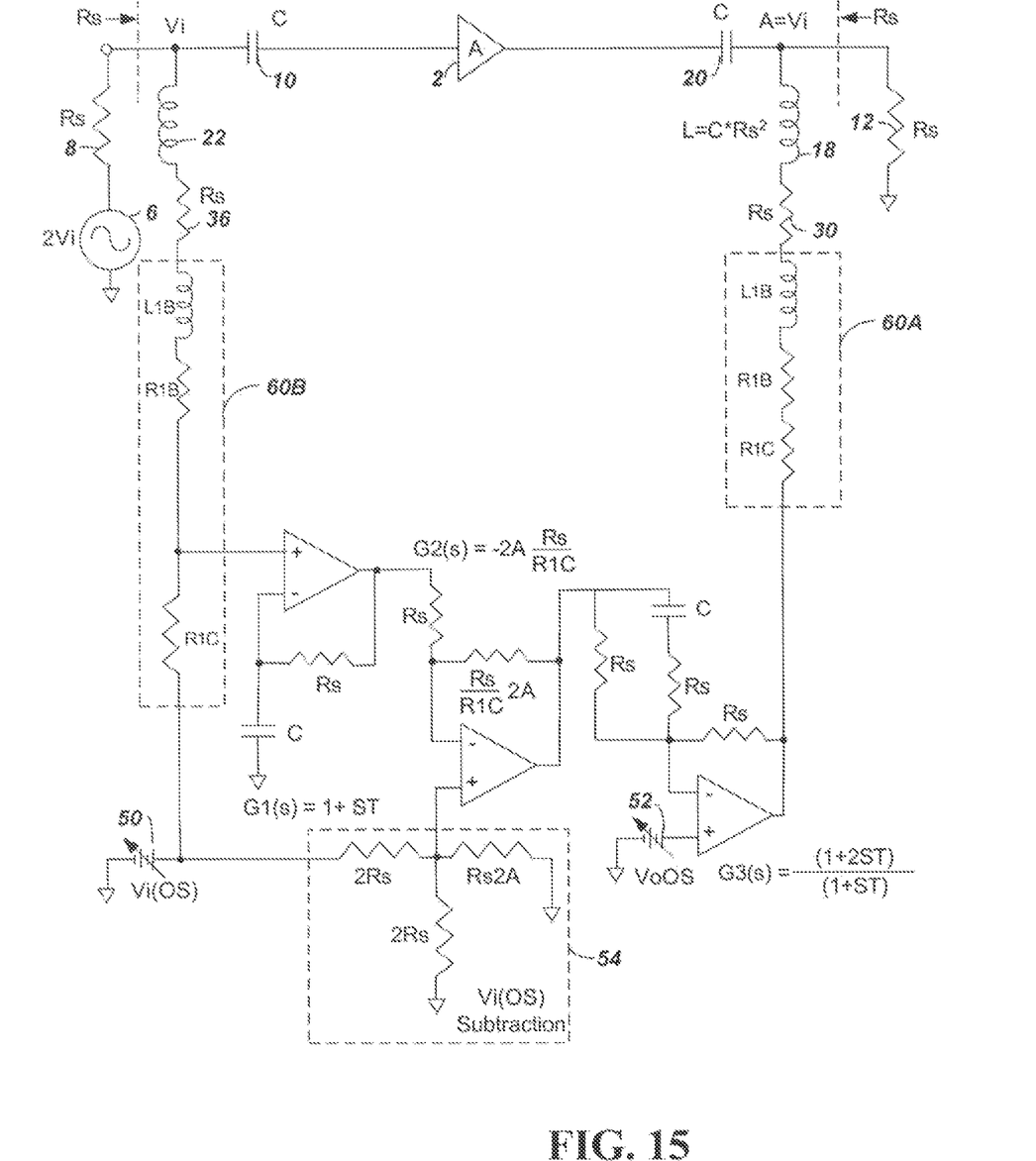
FIG. 15 illustrates providing the additional inductance and resistance from the circuit of FIG. 14 into the circuit of FIG. 13.

FIG. 15 illustrates the provision of the additional inductance and resistances from the circuit of FIG. 14 into the circuit of FIG. 13. Since two Bias T circuits are used, and the input and output are reciprocal, the circuit 60 of FIG. 14 is provided as circuit 60A and 60B at both the input and output in FIG. 15.

Although embodiments of the present invention have been described above to provide a DC bypass around amplifier 2 using Bias T circuits 16 and 21. However, it is understood that components other than a Bias T can be used to provide the DC blocking function of capacitors 10 and 20, and a bypass around the capacitors 10 and 20. Further it is understood that a direct link from the input IN to output OUT is not required to provide the DC bypass. Instead, in one embodiment the input DC voltage is simply measured, and a DC offset voltage generated with a voltage source, similar to the source 40 in FIG. 9.

Although the present invention has been described above with particularity, this was merely to teach one of ordinary skill in the art how to make and use the invention. Many addition modifications will fall within the scope of the invention, as that scope is defined by the following claims.

What is claimed:

1. A DC coupled microwave amplifier output stage for a signal generator comprising:
   a first Bias T having an input for receiving an AC input signal connected to an input of the amplifier output stage, a DC signal path, and an AC signal path;
   an amplifier having an input connected to the AC signal path of the first Bias T and having an output;
   a second Bias T having an input connected to the output of the amplifier, a DC signal path, and an output providing the output of the amplifier output stage; and
   a DC bias bypass circuit having a first terminal connected to the DC signal path of the first Bias T, and a second terminal connected to the DC signal path of the second Bias T, wherein the DC bypass circuit adds DC bias voltage to an AC voltage provided from the amplifier based on DC bias voltage on the first Bias T to provide a DC offset signal at the output of the amplifier output stage.

2. The DC coupled microwave amplifier output stage of claim 1, wherein the DC bias bypass circuit includes a first DC bias voltage adjustment circuit connected to the first Bias T DC signal path, and a second DC bias voltage adjustment circuit connected to the second Bias T DC signal path.

3. A DC coupled microwave amplifier output stage for a signal generator comprising:
   a first Bias T having an input for receiving an AC input signal connected to an input of the amplifier output stage, a DC signal path, and an AC signal path, wherein the first Bias T comprises an inductor of value L having a first terminal connected to the first Bias T input stage and a second terminal, and a capacitor of value C connecting the first Bias T input to the amplifier input;
   an amplifier having an input connected to the AC signal path of the first Bias T and having an output;
   a second Bias T having an input connected to the output of the amplifier, a DC signal path, and an output providing the output of the amplifier output stage, wherein the second Bias T comprises a capacitor with the value C connecting the amplifier output to the output of the amplifier output stage, and an inductance of the value L having a first terminal connecting to the output of the amplifier output stage and a second terminal; and
   a DC bias bypass circuit having a first terminal connected to the DC signal path of the first Bias T, and a second terminal connected to the DC signal path of the second Bias T, wherein the DC bias bypass circuit comprises a first resistor having value Rs with a first terminal connected to the second terminal of the inductor of the first Bias T and a second terminal, and a second resistor of value Rs with a first terminal connected to the second terminal of the inductor of the second Bias T and a second terminal, both the first and second resistors having the value Rs; and
   wherein the inductance L is set equal to C times $Rs^2$.

4. The DC coupled microwave amplifier output stage of claim 3, wherein the value of Rs is set equal to the resistance of a stage connected to the input of the amplifier output.

5. The DC coupled microwave amplifier output stage of claim 3, wherein a voltage Vi is provided to the input of the first Bias T, Vo is a voltage provided at the output of the second Bias T, and A is the gain of the amplifier, wherein $$Vo = AVi\left(\frac{ST}{1+ST}\right)^2$$

wherein $S=2\pi f$, wherein f is frequency, and wherein T is time.

6. The DC coupled microwave amplifier output stage of claim 3, wherein the DC bias bypass circuit provides a DC bias voltage of value $V_L$ to the second terminal of the second resistor, and wherein $$V_L = 2AVi\left(\frac{1+2ST}{1+ST}\right)$$

wherein A is a gain of the amplifier, S is $2\pi f$, f is frequency, T is time, and Vi is the voltage at the input of the first Bias T.

7. The DC coupled microwave amplifier output stage of claim 3, wherein the DC bias bypass circuit provides a bias signal from the first terminal of the first resistor of the DC bias circuit to the second terminal of the second resistor of the DC bias bypass circuit, the bias signal having a value Vi/(1+ST) multiplied by a function G(s) generated by the DC bias circuit to provide a voltage at the output of the amplifier output stage, wherein Vi is the voltage at the input of the first Bias T, and G(s) is a function in terms of an operation frequency set so that the output of the second Bias T provides a voltage Vo=AVi.

8. The DC coupled microwave amplifier output stage of claim 7, wherein $$G(s)=1+ST$$

wherein S is $2\pi f$, f is frequency, and wherein T is time.

9. The DC coupled microwave amplifier output stage of claim 7, wherein $$G(s) = \frac{2A(1+2ST)}{2(1+ST)}$$

wherein $S=2\pi f$, f is frequency, and T is time.

10. The DC coupled microwave amplifier output stage of claim 9, wherein the term G(s)=G1(s)G2(s)G3(s), wherein the DC bias bypass circuit includes a first circuit providing G1(s) connected in series with a second circuit providing G2(s), connected in series with a third circuit providing G3(s), wherein $$G1(s) = \frac{1}{1+ST}$$
$$G2(s) = 2A, \text{ and}$$
$$G3(s) = \frac{(1+2ST)}{(1+ST)}.$$

11. The DC coupled microwave amplifier output stage of claim 10, wherein a first DC offset voltage is added in the first circuit at least partially subtracted in the second circuit, and a second DC offset voltage is added in the third circuit.

12. The DC coupled microwave amplifier output stage of claim 11, wherein the DC bias bypass circuit further comprises a series connected resistor and inductor connecting the second terminal of the second resistor to receive the bias voltage.

13. The DC coupled microwave amplifier output of claim 1, wherein the signal generator comprises at least one of a pulse generator, a square wave generator and a sine wave generator.

14. A DC coupled microwave amplifier comprising:
an amplifier;
a first DC blocking capacitor connecting an input of the DC coupled microwave amplifier circuit to an input of the amplifier;
a second DC blocking capacitor connecting an output of the amplifier to an output of the DC coupled microwave amplifier circuit; and
a DC bias bypass circuit having a first terminal connected to the input of the DC coupled microwave amplifier circuit and an output coupled to the output of the DC coupled microwave amplifier circuit to provide a DC bias signal to the output of the DC coupled microwave amplifier that is a function of a signal provided to the input of the DC coupled microwave amplifier, wherein the DC bias signal is added to an AC voltage provided from the amplifier to provide a DC offset signal to the output of the DC coupled microwave amplifier.

15. The DC coupled microwave amplifier of claim 14 farther comprising at least one DC bias adjustment circuit providing a DC bias to the output of the DC coupled microwave amplifier in addition to a DC bias voltage from the DC bias bypass circuit.

16. A DC coupled microwave amplifier comprising:
an amplifier;
a first DC blocking capacitor connecting an input of the DC coupled microwave amplifier to an input of the amplifier;
a second DC blocking capacitor connecting an output of the amplifier to the output of the DC coupled microwave amplifier; and
a DC bias circuit connected to the output of the DC coupled microwave amplifier circuit for providing a DC offset to an AC signal provided from the amplifier, wherein the DC offset is a function of a DC signal component measured at the input of the DC coupled microwave amplifier circuit.

17. The DC coupled microwave amplifier of claim 16, further comprising:
an inductor connecting the DC bias circuit to the output of the DC coupled microwave amplifier circuit.

18. The DC coupled microwave amplifier of claim 14, further comprising:
an inductor connected in series with the DC coupled microwave amplifier between the input of the DC coupled microwave amplifier circuit and the output of the DC coupled microwave amplifier circuit.

19. The DC coupled microwave amplifier of claim 14, further comprising:
a first inductor connecting the first terminal of the DC bias circuit to the input of the DC coupled microwave amplifier circuit; and
a second inductor connecting the DC bias circuit to the output of the DC coupled microwave amplifier circuit.

20. A DC coupled microwave amplifier comprising:
an amplifier;
a DC blocking capacitor connected in series with the amplifier between an input and an output of the DC coupled microwave amplifier;
a DC bias circuit connected in parallel with the amplifier, the DC bias circuit providing a DC bias signal to the output of the DC coupled microwave amplifier that is a function of a signal provided to the input of the DC coupled microwave amplifier, wherein the DC bias signal is added to an AC voltage provided from the amplifier to provide a DC offset signal at the output of the DC coupled microwave amplifier.

21. The DC coupled microwave amplifier of claim 20, further comprising:
an inductor connected in series with the DC coupled microwave amplifier between the input of the DC coupled microwave amplifier circuit and the output of the DC coupled microwave amplifier circuit.

* * * * *